(12) United States Patent
Kim et al.

(10) Patent No.: US 9,042,163 B2
(45) Date of Patent: May 26, 2015

(54) MEMORY DEVICE HAVING A LOCAL CURRENT SINK

(75) Inventors: Jung Pill Kim, San Diego, CA (US); Hari Rao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1092 days.

(21) Appl. No.: 12/778,337

(22) Filed: May 12, 2010

(65) Prior Publication Data

US 2011/0280057 A1 Nov. 17, 2011

(51) Int. Cl.
G11C 11/00 (2006.01)
G11C 29/02 (2006.01)
G11C 29/12 (2006.01)
G11C 13/00 (2006.01)

(52) U.S. Cl.
CPC .......... G11C 29/02 (2013.01); *G11C 13/0069* (2013.01); G11C 29/025 (2013.01); G11C 29/12005 (2013.01); *G11C 2013/0073* (2013.01); *G11C 2013/0078* (2013.01); *G11C 2029/1204* (2013.01)

(58) Field of Classification Search
USPC ................. 365/148, 158, 171, 173
See application file for complete search history.

(56) References Cited

U.S. PATENT DOCUMENTS

| | | | |
|---|---|---|---|
| 6,813,181 B1 | 11/2004 | Viehmann et al. | |
| 7,272,034 B1 * | 9/2007 | Chen et al. | 365/158 |
| 7,646,627 B2 * | 1/2010 | Hidaka | 365/158 |
| 7,672,152 B1 * | 3/2010 | Kulkarni et al. | 365/154 |
| 8,004,880 B2 | 8/2011 | Yoon et al. | |
| 2007/0091671 A1 | 4/2007 | Ooishi et al. | |
| 2008/0247222 A1 | 10/2008 | Jung et al. | |
| 2009/0262571 A1 | 10/2009 | Sakimura et al. | |

FOREIGN PATENT DOCUMENTS

| | | |
|---|---|---|
| CN | 101243518 A | 8/2008 |
| JP | 2007134027 A | 5/2007 |
| JP | 2007287193 A | 11/2007 |
| JP | 2010027178 A * | 2/2010 |
| WO | WO 2007142137 A1 * | 12/2007 |
| WO | WO-2008109772 A1 | 9/2008 |

OTHER PUBLICATIONS

Freescale Semiconductor, MRAM Technical Guide, Rev 1, Retrieved from http://www.freescale.com/files/microcontrollers/doc/brochure/BRMRAMTECHGUIDE.pdf, 2007, [retrieved on Aug. 11, 2013].*
R. Nebashi, N. Sakimura, H. Honjo, et al., "SRAM and Emerging Memory/27.4", 2009 IEEE International Solid State Circuits Conference, pp. 462-463.
International Search Report and Written Opinion—PCT/US2011/035928—ISA/EPO—Aug. 4, 2011.

* cited by examiner

*Primary Examiner* — Harry W Byrne
*Assistant Examiner* — Lance Reidlinger
(74) *Attorney, Agent, or Firm* — Donald D. Min

(57) ABSTRACT

A memory device having a local current sink is disclosed. In a particular embodiment, an electronic device is disclosed. The electronic device includes one or more write drivers. The electronic device includes at least one Magnetic Tunnel Junction (MTJ) coupled to a bit line and coupled to a source line. The electronic device also includes a current sink circuit comprising a single transistor, the single transistor coupled to the bit line and to the source line.

26 Claims, 6 Drawing Sheets

MEMORY DEVICE HAVING A LOCAL CURRENT SINK

I. FIELD

The present disclosure is generally related to a memory device having a local current sink.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet Protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities and may use a memory device.

A memory device, such as a Magneto-resistive Random Access Memory (MRAM), may have parasitic resistance, i.e. resistance inherent in the design materials. Parasitic resistance may result in increased current and power requirements when performing a write operation, which is generally undesirable.

III. SUMMARY

A Spin Torque Transfer MRAM (STT-MRAM) is disclosed that includes a current sink circuit that provides a bit line discharge path to a local ground. In a particular implementation, the current sink circuit may have a single transistor. In another particular implementation, a second transistor may enable a test mode signal to selectively disable the bit line discharge path to the local ground. Providing a discharge path for the bit line to a local ground reduces a parasitic resistance associated with the bit line and may reduce a source loading effect during a data write operation.

In a particular embodiment, an electronic device is disclosed. The electronic device includes one or more write drivers. The electronic device includes at least one Magnetic Tunnel Junction (MTJ) coupled to a bit line and coupled to a source line. The electronic device also includes a current sink circuit having a single transistor. The single transistor is coupled to the bit line and to the source line.

In another particular embodiment, the electronic device includes at least one resistive memory coupled to a bit line and to a source line. The electronic device includes a current sink circuit that has a single discharge path. The single discharge path is configured to couple the bit line to a local ground.

In another particular embodiment, a method includes initiating a first write operation at a Magnetic Tunnel Junction (MTJ) coupled to a bit line and to a source line. The first write operation applies a first voltage to the bit line to store a first data value at the MTJ and has a first discharge path to ground via a write driver. The method includes initiating a second write operation at the MTJ. The second write operation applies a second voltage to the source line to store a second data value at the MTJ and has a second discharge path to ground via a current sink circuit. The second discharge path to ground via the current sink circuit driver is shorter than the first discharge path to ground via the write driver.

One particular advantage provided by at least one of the disclosed embodiments is a reduced parasitic resistance for a write operation when the current sink circuit is activated as compared to the parasitic resistance when the current sink circuit is not activated. Another particular advantage provided by at least one of the disclosed embodiments is a reduced source loading effect for a write operation when the current sink circuit is activated compared to when the current sink circuit is not activated.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
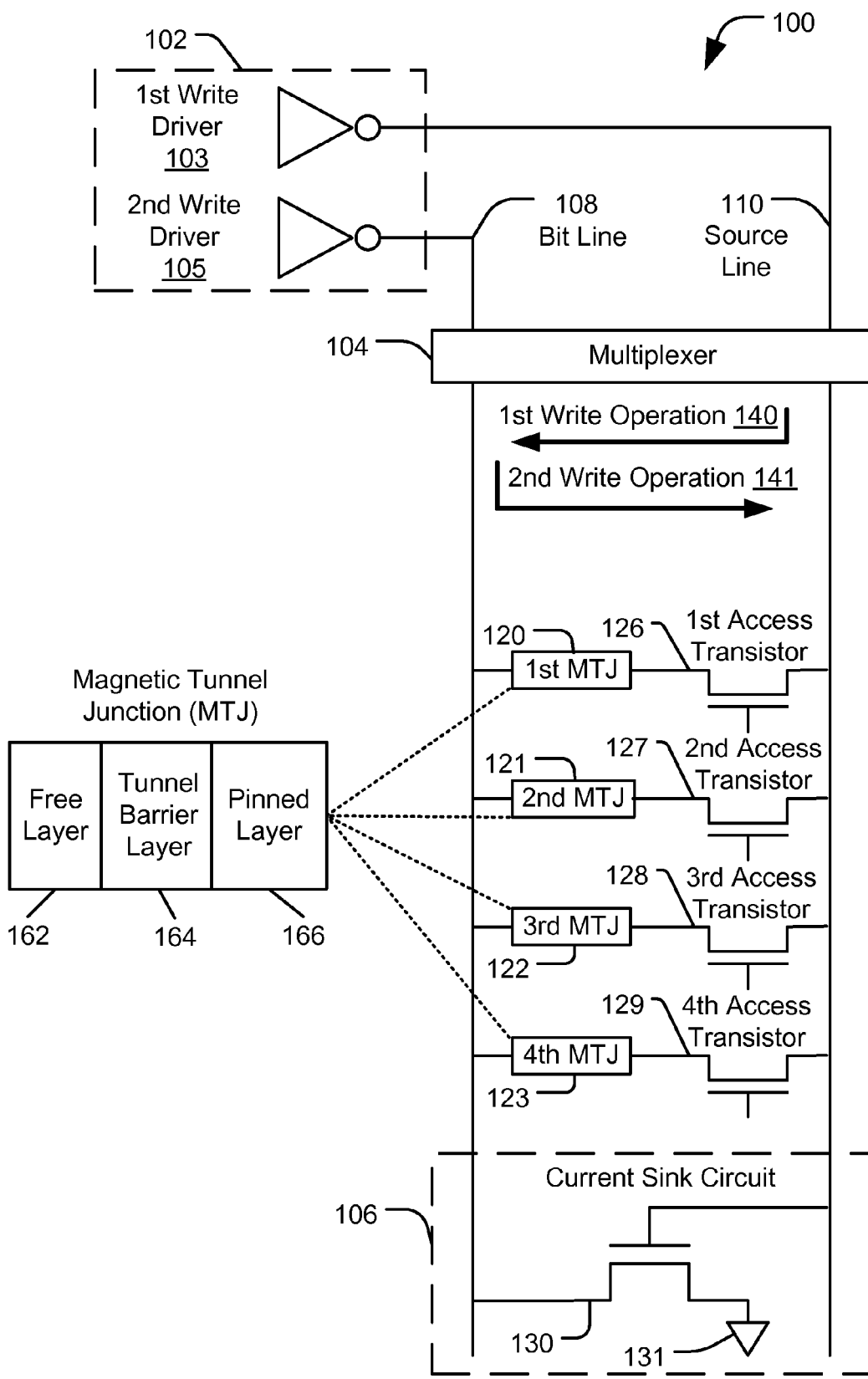
FIG. 1 is a block diagram of a first illustrative embodiment of a memory device having a local current sink.

Referring to FIG. 1, a block diagram of a first illustrative embodiment of a memory device having a local current sink is disclosed and generally designated 100. The memory device 100 includes write drivers 102 coupled to a bit line 108 and to a source line 110 via a multiplexer 104. The memory device 100 includes at least one Magnetic Tunnel Junction (MTJ), such as the first MTJ 120 that is coupled to the bit line 108 and coupled to the source line 110 via a first access transistor 126. A second MTJ 121 may be coupled to the bit line 108 and coupled to the source line 110 via a second access transistor 127. A third MTJ 122 may be coupled to the bit line 108 and coupled to the source line 110 via a third access transistor 128. A fourth MTJ 123 may be coupled to the bit line 108 and coupled to the source line 110 via a fourth access transistor 129. A current sink circuit 106, including a single transistor 130, is coupled to the bit line 108 and to the source line 110.

The write drivers 102 may include one or more write drivers, such as the first write driver 103 and the second write driver 105. The write drivers 102 may provide a write current to the bit line 108 or the source line 110. When a write operation is performed, one of the write drivers 102 goes high (e.g., provides a voltage $V_{DD}$) to generate a write a current and the other write driver goes low (e.g., provides a ground).

The multiplexer 104 may be configured to selectively couple the write drivers 102 to a bit line-source line pair, such as the bit line 108 and the source line 110 pair, when a write operation is performed at one or more of the MTJs 120-123.

For example, the multiplexer 104 may couple the first write driver 103 to the bit line 108 or to the source line 110 and may couple the second write driver 105 to the bit line 108 or to the source line 110.

Each of the MTJs 120-123 may include at least a free layer 162, a tunnel barrier layer 164, and a pinned layer 166. The MTJs 120-123 may be coupled to the bit line 108 and to the source line 110 between the current sink circuit 106 and the write drivers 102. The access transistors 126-129 may be configured to selectively couple one or more of the MTJs 120-123 to the source line 110, such as in response to a word line signal (not shown).

The current sink circuit 106 includes a single transistor 130. In a particular embodiment, the transistor 130 has a width less than or equal to two micrometers. The current sink circuit 106 may provide a path to a ground 131 for a write operation, thereby reducing a path taken by a write current from the write drivers 102. For example, when a write operation is performed to the fourth MTJ 123 and the current sink circuit 106 is not present in the memory device 100, the path of the write current may be approximately twice the length of the bit line 108, i.e. from the first write driver 103 to the fourth MTJ 123 and from the fourth MTJ 123 to the second write driver 105. When a write operation is performed to the fourth MTJ 123 and the current sink circuit 106 is present in the memory device 100, the path of the write current may be approximately the length of the bit line 108, i.e. from the first write driver 103 to the fourth MTJ 123 and from the fourth MTJ 123 to the ground 131. Thus, when writing to an MTJ (e.g. the fourth MTJ 123) that is located the farthest from the write drivers 102, the current sink circuit 106 may reduce the path of the write current by approximately fifty percent compared to when the current sink circuit 106 is not present in the memory device 100. Reducing the path of the write current may reduce a parasitic resistance (e.g., resistance inherent in the types of material used in the memory device 100) of a write operation, thereby reducing a source loading effect and reducing an amount of write current used to perform a write operation.

In operation, when a write operation is performed, one write driver of the pair of write drivers 102 goes high (e.g., $V_{DD}$) and another write driver of the pair or write rivers 102 goes low (e.g., act as a ground). For example, when the first write operation 140 is performed, the first write driver 103 may go high and the second write driver 105 may go low, causing a write current to flow from the first write driver 103 to one of the MTJs 120-123 via the multiplexer 104. The write current may flow from one of the MTJs 120-123 to the second write driver 105 or the current sink circuit 106, depending on which path is shortest. To illustrate, when performing the first write operation 140 to the first MTJ 120, the write current may flow from the first write driver 103, through the multiplexer 104, the source line 110, and the first access transistor 126 to the first MTJ 120. From the first MTJ 120, the write current may flow to the bit line 108, through the multiplexer 104, to the second write driver 105 because the path from the first MTJ 120 to the second write driver 105 is shorter than the path from the first MTJ 120 to the current sink circuit 106. As a second illustration, when performing the first write operation 140 to the fourth MTJ 123, the write current may flow from the first write driver 103, through the multiplexer 104, the source line 110, and the fourth access transistor 129 to the fourth MTJ 123. From the fourth MTJ 123, the write current may flow to the bit line 108 to the current sink circuit 106 because the path from the fourth MTJ 123 to the second write driver 105 is longer than the path from the fourth MTJ 123 to the current sink circuit 106.

When the second write operation 141 is performed, the second write driver 105 may go high and the first write driver 103 may go low, causing a write current to flow from the second write driver 105 to one of the MTJs 120-123 via the multiplexer 104. The write current will flow from one of the MTJs 120-123 to the first write driver 103 because the current sink circuit 106 provides a discharge path to the bit line 108, and not to the source line 110. To illustrate, when performing the second write operation 141 to the first MTJ 120, the write current may flow from the second write driver 105, through the multiplexer 104, the bit line 108, to the first MTJ 120. From the first MTJ 120, the write current may flow through the first access transistor 126 to the source line 110, through the multiplexer 104, to the first write driver 103. As a second illustration, when performing the second write operation 141 to the fourth MTJ 123, the write current may flow from the second write driver 105, through the multiplexer 104, the bit line 108, to the fourth MTJ 123. From the fourth MTJ 123, the write current may flow through the fourth access transistor 129 and the source line 110 to first write driver 103.

A write operation that encounters one of the MTJs 120-123 before encountering one of the access transistors 126-129 may require less write current than a write operation that encounters one of the access transistors 126-129 before encountering one of the MTJs 120-123. Thus, the first write operation 140 may require more current than the second write operation 141 because the second write operation 141 may encounter one of the MTJs 120-123 before one of the access transistors 126-129. Because the first write operation 140 may benefit more from the current sink circuit 106 than would the second write operation 141, the current sink circuit 106 is provided to reduce a path of a write current of the first write operation 140.

Thus, the current sink circuit 106 may provide a path to the ground 131 during the first write operation 140 and thereby reduce a length of a path that a write current travels during the first write operation 140. By reducing the path that the write current travels during the first write operation 140, a parasitic resistance encountered during the first write operation 140 may be reduced. Reducing parasitic resistance encountered during the first write operation 140 may result in reducing a source loading effect, thereby reducing an amount of write current required to perform the first write operation 140. Reducing the amount of write current required to perform first write operation 140 may result in less power consumption and lower heat buildup for the memory device 100.

In a particular embodiment, the memory device 100 is incorporated into a Spin Torque Transfer Magneto-resistive Random Access Memory (STT-MRAM) device. The memory device 100 may be integrated in at least one semiconductor die. The memory device 100 may be incorporated into a consumer electronic device, such as a set top box, a music player, a video player, an entertainment unit, a navigation device, a communications device, a personal digital assistant (PDA), a fixed location data unit, and a computer.

Figure 2:
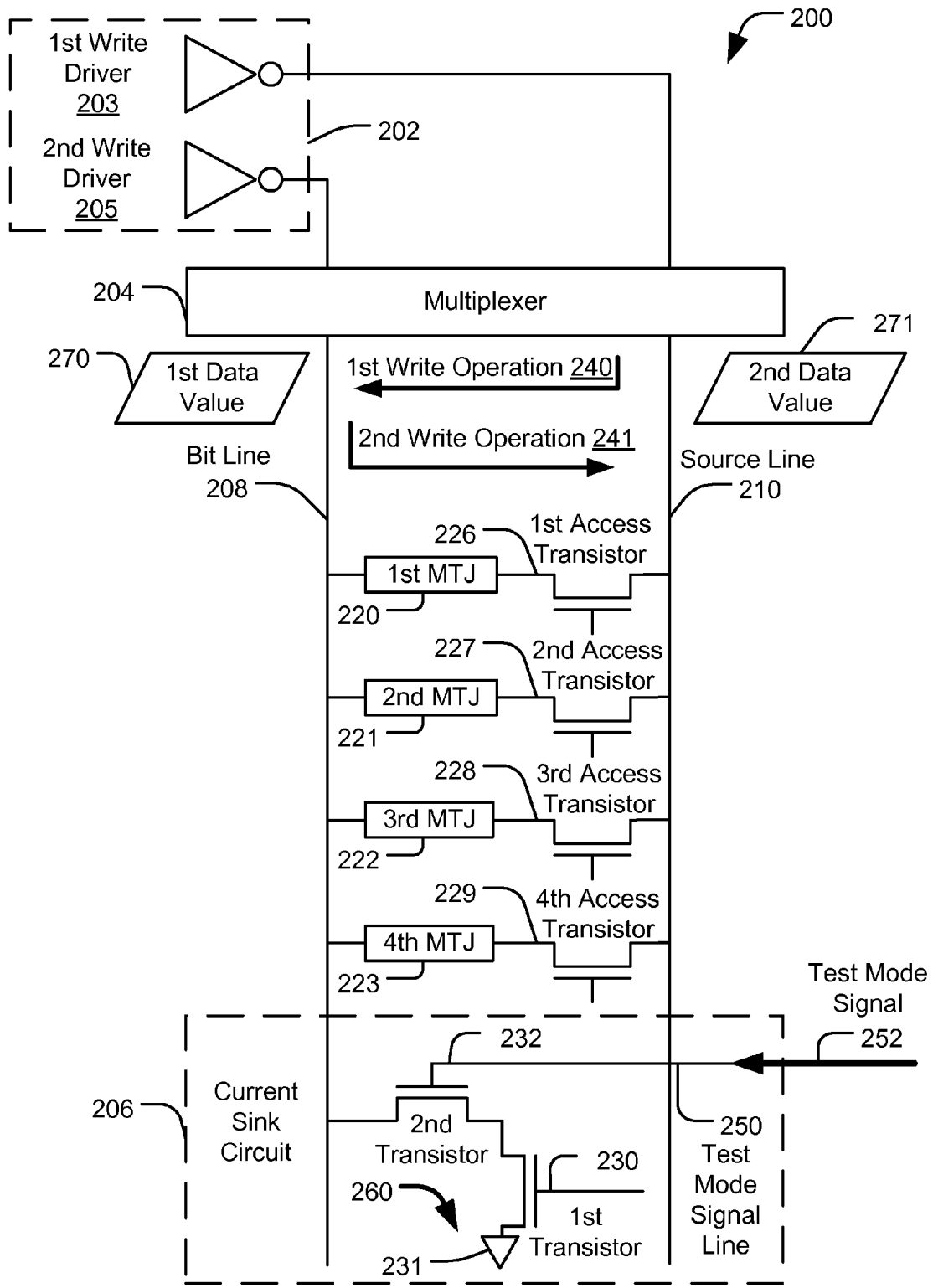
FIG. 2 is a block diagram of a second illustrative embodiment of a memory device having a local current sink.

Referring to FIG. 2, a block diagram of a second illustrative embodiment of a memory device having a local current sink is disclosed and generally designated 200. The memory device 200 includes write drivers 202 coupled to a bit line 208 and to a source line 210 via a multiplexer 204. The memory device 200 includes at least one resistive memory, such as the first MTJ 220 that is coupled to the bit line 208 and coupled to the source line 210 via a first access transistor 226. Additional MTJs, such as the MTJs 221, 222, and 223, may be coupled to the bit line 208 and coupled to the source line 210 via access transistors 227, 228, and 229, respectively. A current sink circuit 206 is coupled to the bit line 208 and the source line 210.

The write drivers 202 include a first write driver 203 and a second write driver 205. The write drivers 202 may generate a write current during a first write operation 240 to write a first data value 270 to one of the MTJs 220-223 or during a second write operation 241 to write a second data value 271 to one of the MTJs 220-223.

The multiplexer 204 may be configured to selectively couple the write drivers 202 to a bit line-source line pair, such as the bit line 208 and the source line 210 pair, to enable the write drivers 202 to provide a write current to the bit line 208 or the source line 210. The write current may travel a path from the write drivers 202, through one or more of the MTJs 220-223, to the current sink circuit 206 or the write drivers 202, based on a length of the path to the current sink circuit 206 and to the write drivers 202 and based on a direction of the write current.

The MTJs 220-223 may be coupled to the bit line 208 and to the source line 210 between the current sink circuit 206 and the write drivers 202. The access transistors 226-229 may be configured to selectively couple one or more of the MTJs 220-223 to the source line 210, such as in response to a word line signal (not shown).

The current sink circuit 206 includes a first transistor 230 and a second transistor 232. The first transistor 230 may provide a single discharge path 260 that couples a write current from the write drivers 202 to a ground 231 when a write operation is performed, thereby reducing a path taken by the write current. A gate of the first transistor 230 is coupled to the source line 210. The bit line 208 is selectively coupled to the ground 231 in response to a test mode signal 252 (e.g., a voltage) at the test mode signal line 250. The second transistor 232 is serially coupled to the first transistor 230 and coupled via a gate of the second transistor 232 to a test mode signal line 250. The second transistor 232 is responsive to a test mode signal 252 sent via the test mode signal line 250 to selectively block a discharge of the bit line 208 through the single discharge path 260 to the ground 231. In a particular embodiment, each of the transistors 230 and 232 has a width less than or equal to two micrometers.

The current sink circuit 206 is configured to provide the single discharge path 260 to the ground 231 for the write drivers 202, thereby reducing a path taken by a write current from the write drivers 102. For example, when a write operation is performed to the fourth MTJ 223 and the current sink circuit 206 is deactivated by sending the test mode signal 252, the path of a write current may be approximately twice the length of the bit line 208, i.e. from the first write driver 103 to the fourth MTJ 223 and from the fourth MTJ 223 to the second write driver 205. When a write operation is performed to the fourth MTJ 223 and the current sink circuit 206 is active in the memory device 200, the path of the write current may be approximately the length of the bit line 208, i.e. from the first write driver 203 to the fourth MTJ 223 via the source line 210 and from the fourth MTJ 223 to the ground 231. Thus, when writing to an MTJ (e.g. the fourth MTJ 223) that is located the farthest from the write drivers 202, the current sink circuit 206 may reduce the path of the write current by approximately fifty percent compared to when the current sink circuit 206 is deactivated in the memory device 200. Reducing the path of the write current may reduce a parasitic resistance (e.g., resistance inherent in the types of material used in the memory device 200) of the first write operation 240, thereby reducing a source loading effect and reducing an amount of write current used to perform a write operation.

In operation, when a write operation is performed, one write driver of the pair of write drivers 202 goes high (e.g., $V_{DD}$) and another write driver of the pair or write rivers 202 goes low (e.g., act as a ground). For example, when the first write operation 240 is performed, the first write driver 203 may go high and the second write driver 205 may go low, causing a write current to flow from the first write driver 203 to one of the MTJs 220-223 via the multiplexer 204. The write current may flow from one of the MTJs 220-223 along the bit line 208 to either the second write driver 205 or the current sink circuit 206, depending on which path is shortest. To illustrate, when performing the first write operation 240 to the first MTJ 220, the write current may flow from the first write driver 203, through the multiplexer 204, the source line 210, and the first access transistor 226 to the first MTJ 220. From the first MTJ 220, the write current may flow to the bit line 208, through the multiplexer 204, to the second write driver 205 because the path from the first MTJ 220 to the second write driver 205 is shorter than the path from the first MTJ 220 to the current sink circuit 206. As a second illustration, when performing the first write operation 240 to the fourth MTJ 223, the write current may flow from the first write driver 203, through the multiplexer 204, the source line 210, and the fourth access transistor 229 to the fourth MTJ 223. From the fourth MTJ 223, the write current may flow along the bit line 208 to the current sink circuit 206, because the path from the fourth MTJ 223 to the second write driver 205 is longer than the path from the fourth MTJ 223 to the current sink circuit 206.

When the second write operation 241 is performed, the second write driver 205 may go high and the first write driver 203 may go low, causing a write current to flow from the second write driver 205 to one of the MTJs 220-223 via the multiplexer 204. The write current may flow from one of the MTJs 220-223 to the first write driver 203. To illustrate, when performing the second write operation 241 to the first MTJ 220, the write current will flow from the second write driver 205, through the multiplexer 204, the bit line 208, to the first MTJ 220. From the first MTJ 220, the write current flows through the first access transistor 226 to the source line 210, through the multiplexer 204, to the first write driver 203. As a second illustration, when performing the second write operation 241 to the fourth MTJ 223, the write current may flow from the second write driver 205, through the multiplexer 204 and the bit line 208, to the fourth MTJ 223. From the fourth MTJ 223, the write current may flow through the fourth access transistor 229 and the source line 210 to the first write driver 203 because the single discharge path 260 of the current sink circuit is not provided to the source line 210, only to the bit line 208.

A write operation that encounters one of the MTJs 220-223 before encountering one of the access transistors 226-229 may require less write current than a write operation that encounters one of the access transistors 226-229 before encountering one of the MTJs 220-223. Thus, the first write operation 240 may require more current than the second write operation 241 because the second write operation 241 may encounter one of the MTJs 220-223 before one of the access transistors 226-229. The first write operation 240 may benefit more from the current sink circuit 206 than the second write operation 241, because the current sink circuit 206 is provided to reduce a path of a write current of the first write operation 240.

Thus, the current sink circuit 206 may provide a path to the ground 231 during the first write operation 240 and thereby reduce a length of a path that a write current travels during the first write operation 240. By reducing the path that the write current travels during the first write operation 240, a parasitic resistance encountered during first write operation 240 may be reduced. Reducing parasitic resistance encountered during the first write operation 240 may result in reducing a source loading effect, thereby reducing an amount of write current required to perform the first write operation 240. Reducing the amount of write current required to perform the first write operation 240 may result in less power consumption and lower heat buildup for the memory device 200.

In a particular embodiment, the memory device 200 is incorporated into a Resistive Random Access Memory (R-RAM) device. The memory device 200 may be integrated in at least one semiconductor die. In a particular embodiment, the memory device 200 is incorporated into a consumer electronic device, such as a set top box, a music player, a video player, an entertainment unit, a navigation device, a communications device, a personal digital assistant (PDA), a fixed location data unit, and a computer.

Figure 3:
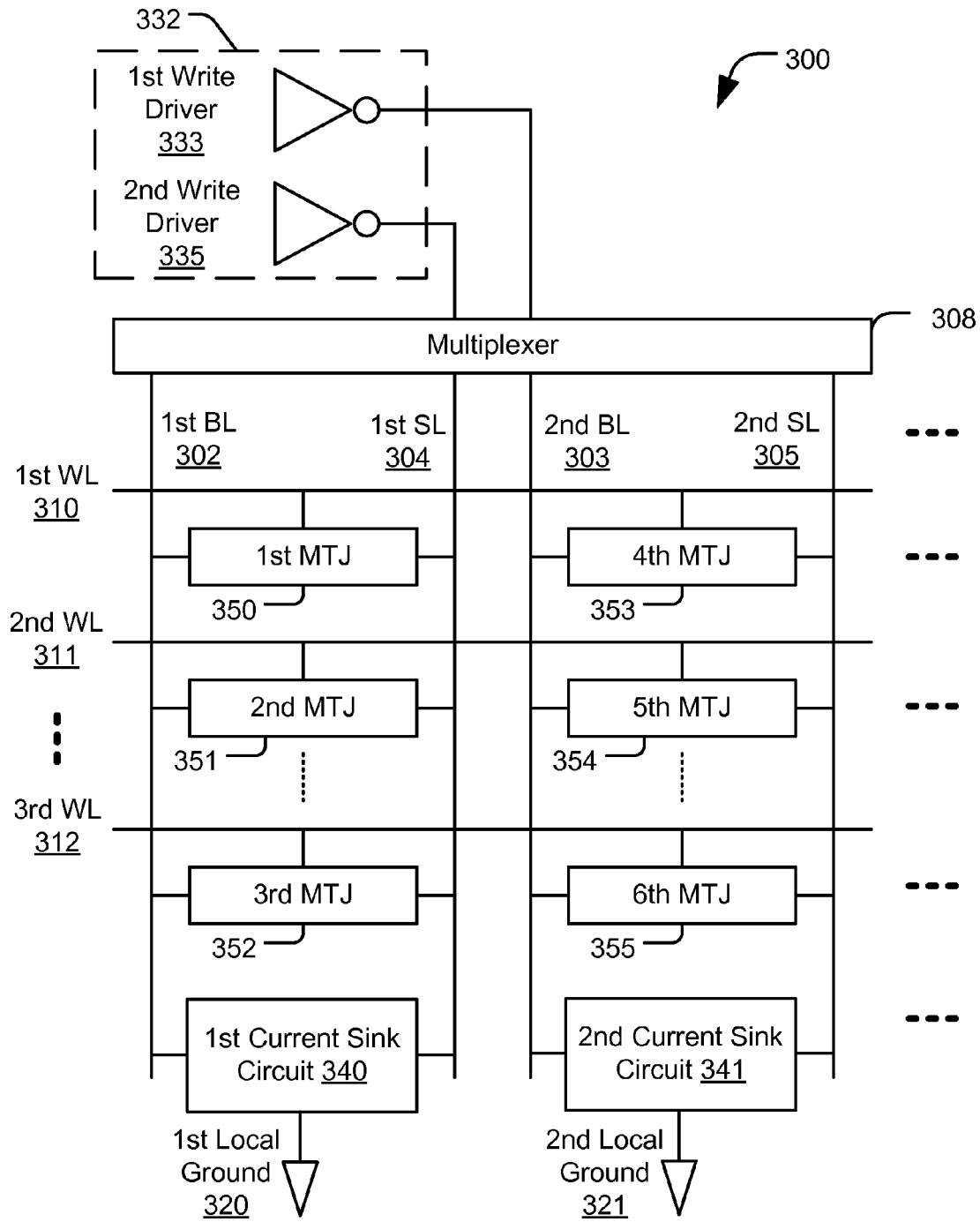
FIG. 3 is a block diagram of a third illustrative embodiment of a memory device having a local current sink.

Referring to FIG. 3, a block diagram of a third illustrative embodiment of a memory device having a local current sink is disclosed and generally designated 300. The system 300 includes write drivers 332 coupled to bit lines 302 and 303, and to source lines 304 and 305, via a multiplexer 308.

A first MTJ 350 is coupled to the bit line 302, the source line 304, and a word line 310. A second MTJ 351 is coupled to the bit line 302, the source line 304, and a word line 311. A third MTJ 352 is coupled to the bit line 302, the source line 304, and a word line 312. A fourth MTJ 353 is coupled to the bit line 303, the source line 305, and the word line 310. An fifth MTJ 354 is coupled to the bit line 303, the source line 305, and the word line 311. A sixth MTJ 355 is coupled to the bit line 303, the source line 305, and the word line 312. Each of the MTJs 350-355 may be part of a bit cell that also includes an access transistor (not shown). A first current sink circuit 340 is coupled to the bit line 302, the source line 304, and a first local ground 320. A second current sink circuit 341 is coupled to the bit line 303, the source line 305, and a second local ground 321.

When the write drivers 332 write to one or more of the MTJs 350-355, the multiplexer 308 may selectively couple the write drivers 332 to a bit line-source line pair, such as the bit line 302 and the source line 304 pair or the bit line 303 and the source line 305 pair.

The first current sink circuit 340 may selectively provide a discharge path to the first ground 320 for a write current travelling via the bit line 302 and via the source line 304. The second current sink circuit 341 may selectively provide a discharge path to the second ground 321 for a write current travelling via the bit line 303 and via the source line 305. Each current sink circuit 340-341 may be implemented as a single transistor current sink circuit, such as the current sink circuit 106 of FIG. 1, or as a selectable current sink circuit, such as the current sink circuit 206 of FIG. 2. When a write operation is performed by the write drivers 332, a discharge path from one of the write drivers 332 to one of the grounds 320-321 may be shorter than a discharge path from one of the write drivers 332 to the other of the write drivers 332.

The write drivers 332 may include one or more write drivers, such as a first write driver 333 and a second write driver 335. The write drivers 332 may provide a write current to a bit line-source line pair. When a write operation is performed, one the write drivers 302 goes high (e.g., generating a $V_{DD}$) to provide a write current and the other write driver goes low (e.g., provides a ground). The current may flow from the write driver that goes high to either the write driver that goes low or to one of the current sinks 320-321. For example, when writing to the first MTJ 350, the first write driver 333 may go high and the second write driver 335 may go low. The current may flow from the first write driver 333, through the multiplexer 308 and the source line 304 to the first MTJ 350 and from the first MTJ 350 through the bit line 302 and the multiplexer 308 to the second write driver 335. In this example, write current flows from the first write driver 333 to the second write driver 335 because a path of the write current from the first write driver 333 to the second write driver 335 is shorter than a path of the write current from the first write driver 333 to the first current sink circuit 340. In another example, when writing to the third MTJ 352, the first write driver 333 may go high and the second write driver 335 may go low. The current may flow from the first write driver 333, through the multiplexer 308 and the source line 304 to the third MTJ 352 and from the third MTJ 352 through the bit line 302 to the first current sink circuit 340. In this example, write current flows from the first write driver 333 to the first current sink circuit 340 because the path of the write current from the first write driver 333 to the second write driver 335 is longer than the path of the write current from the first write driver 333 to the first current sink circuit 340.

In operation, when the current sink circuits 340-341 are activated in the memory device 300, performing a write operation may cause a write current to flow from the write drivers 332 through one of the MTJs 350-355 to either one of the current sink circuits 320-321 or back to the write drivers 332. For example, when writing to the fourth MTJ 353, the bit line 303 and the source line 305 may be selected via the multiplexer 308. The second write driver 335 may go high and the first write driver 333 may go low, causing a write current to flow through the multiplexer 308 and the source line 305 to the fourth MTJ 353 and from the fourth MTJ 353, through the bit line 303 and the multiplexer 308, to the first write driver 333. In this example, the write current travels from the second write driver 335 back to the first write driver 333 because the path from the second write driver 335 to the first write driver 333 is shorter than the path from the second write driver 335 to the second current sink 341. In another example, when writing to the sixth MTJ 355, the bit line 303 and the source line 305 may be selected via the multiplexer 308. The second write driver 335 may go high and the first write driver 333 may go low, causing a write current to flow through the multiplexer 308 and the source line 305 to the sixth MTJ 355 and from the sixth MTJ 355, through the bit line 303 to the second local ground 321. In this example, write current travels from the second write driver 335 back to second local ground 321 because the path from the second write driver 335 to the second local ground 321 is shorter than the path from the second write driver 335 to the first write driver 333.

Thus, the current sink circuits 340-341 may provide a discharge path to the grounds 320-321 during a write operation that results in write current taking a shorter path to ground compared to when the current sink circuits 340-341 are deactivated in the memory device 300. By reducing the path that the write current travels during a write operation, a parasitic resistance encountered during the write operation may be reduced by up to approximately fifty percent. For example, when writing to the MTJ farthest from the write drivers (e.g. a worst case without the current sinks 340-341), the length of a path taken by the write current to one of the current sink circuits 340-341 may be approximately half of the length of a path taken by the write current to the write drivers. Reducing parasitic resistance encountered during the write operation may result in reducing a source loading effect, reducing an amount of write current required to perform a write operation. Reducing the amount of write current required to perform a write operation may result in less power consumption and lower heat buildup for the memory device 300.

Figure 4:
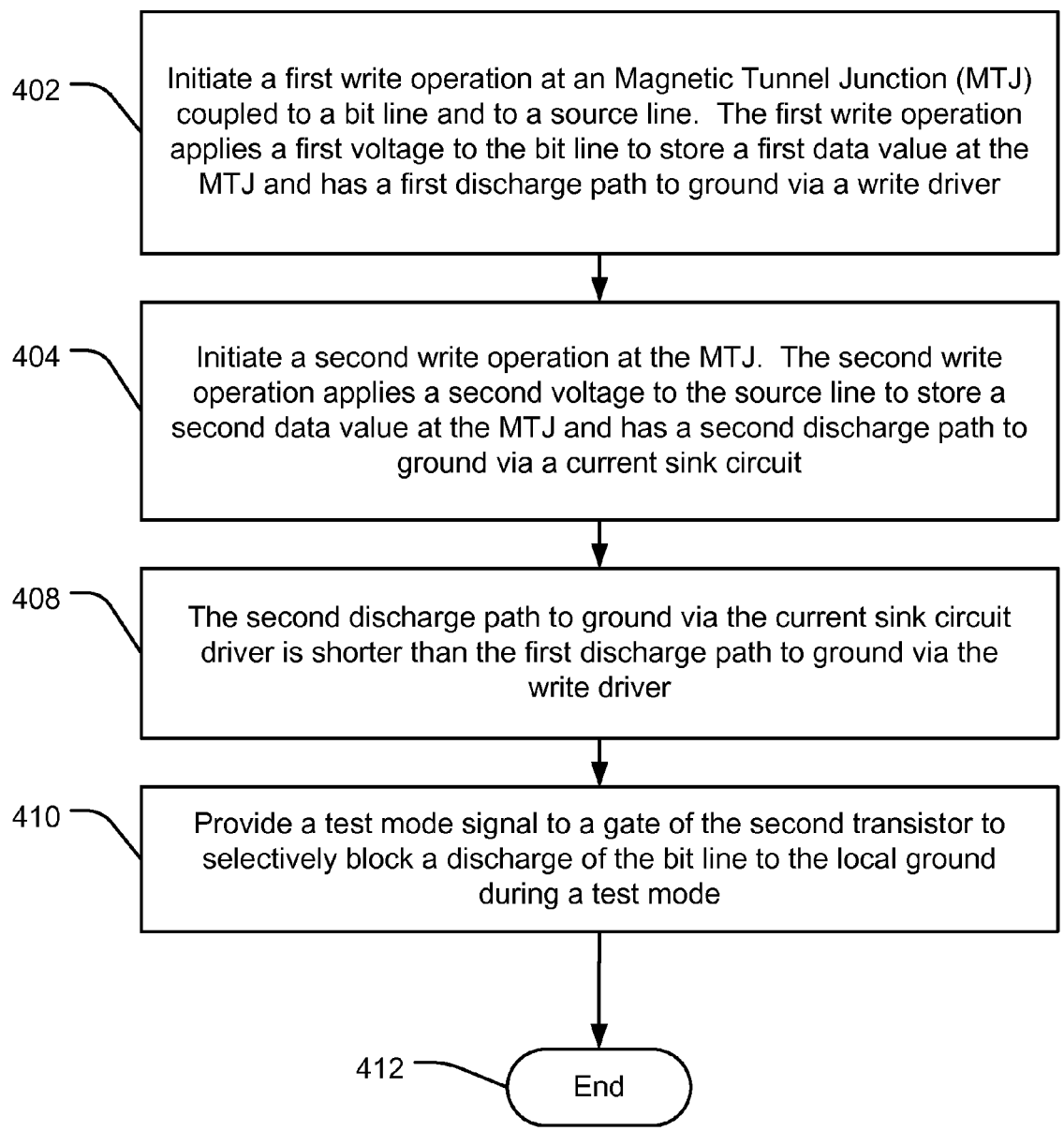
FIG. 4 is a flow diagram of method of providing a local discharge path.

FIG. 4 is a flow diagram of a method of providing a single discharge path. The method may be performed by a memory device, such as the memory device 100 of FIG. 1, the memory device 200 of FIG. 2, and the memory device 300 of FIG. 3.

The method begins by initiating a first write operation at an MTJ coupled to a bit line and to a source line, at 402. The first write operation applies a first voltage to the bit line to store a first data value at the MTJ and has a first discharge path to ground via a write driver. For example, in FIG. 2, the second write operation 241 may provide a first voltage to store the second data value 271 at one of the MTJs 220-223. The first write operation 240 may have a first discharge path to ground via one of the write drivers 203. Moving to 404, a second write operation may be initiated at the MTJ. The second write operation applies a second voltage to source line to store a second data value at the MTJ and has a second discharge path to ground via a current sink circuit. For example, in FIG. 2, the first write operation 240 may provide a first voltage to store the second data value 270 at one of the MTJs 220-223. The first write operation 340 may have a first discharge path to ground via the current sink circuit 206.

Advancing to 408, the second discharge path to ground via the current sink circuit driver is shorter than the first discharge path to ground via the write driver. Continuing to 410, a test mode signal may be provided to a gate of the second transistor to selectively block a discharge of the bit line to the local ground during a test mode. For example, in FIG. 2, the test mode signal 252 may selectively deactivate the single discharge path 260 to the local ground 231. The method ends at 412.

Thus, a current sink circuit may provide a discharge path to a local ground during a second write operation but not during a first write operation. The single discharge path may reduce a length of a path that a write current travels during the second write operation. By reducing the length of the path that the write current travels during the second write operation, the parasitic resistance encountered during the second write operation may be reduced compared to when the current sink circuit is deactivated or not present in a memory device.

Figure 5:
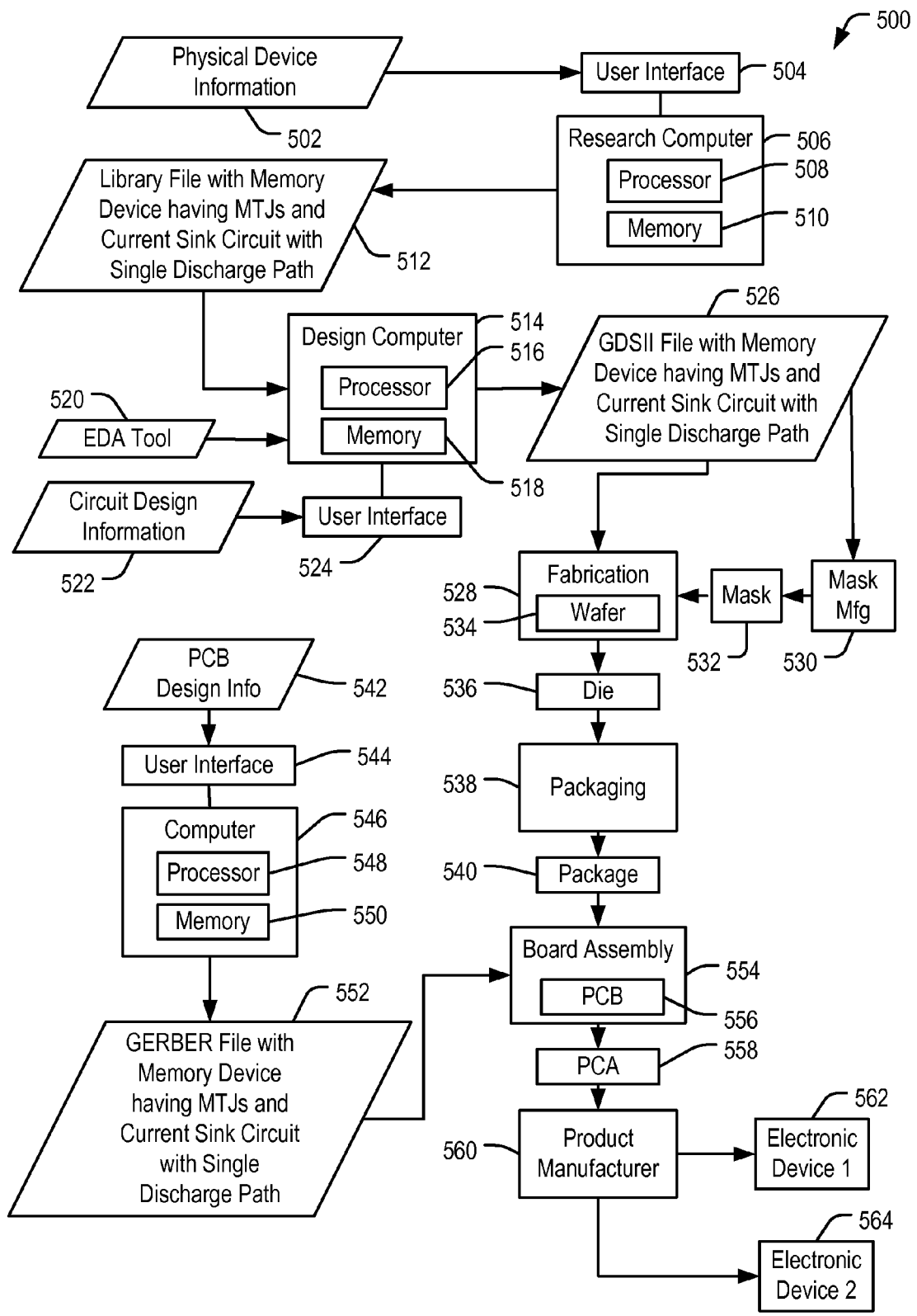
FIG. 5 is an illustrative embodiment of a method of manufacturing an integrated circuit device having a memory device that includes a local current sink.

FIG. 5 is a data flow diagram of a particular illustrative embodiment of a manufacturing process to manufacture electronic devices that include a memory device having MTJs and a current sink circuit with a single discharge path.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 5 depicts a particular illustrative embodiment of an electronic device manufacturing process 500.

Physical device information 502 is received in the manufacturing process 500, such as at a research computer 506. The physical device information 502 may include design information representing at least one physical property of a semiconductor device, such as the memory device 100 of FIG. 1, the memory device 200 of FIG. 2, the memory device 300 of FIG. 3, or any combination thereof. For example, the physical device information 502 may include physical parameters, material characteristics, and structure information that is entered via a user interface 504 coupled to the research computer 506. The research computer 506 includes a processor 508, such as one or more processing cores, coupled to a computer readable medium such as a memory 510. The memory 510 may store computer readable instructions that are executable to cause the processor 508 to transform the physical device information 502 to comply with a file format and to generate a library file 512.

In a particular embodiment, the library file 512 includes at least one data file including the transformed design information. For example, the library file 512 may include a library of semiconductor devices including the memory device 100 of FIG. 1, the memory device 200 of FIG. 2, the memory device 300 of FIG. 3, or any combination thereof, that is provided for use with an electronic design automation (EDA) tool 520.

The library file 512 may be used in conjunction with the EDA tool 520 at a design computer 514 including a processor 517, such as one or more processing cores, coupled to a memory 518. The EDA tool 520 may be stored as processor executable instructions at the memory 518 to enable a user of the design computer 514 to design a circuit using the memory device 100 of FIG. 1, the memory device 200 of FIG. 2, the memory device 300 of FIG. 3, or any combination thereof, of the library file 512. For example, a user of the design computer 514 may enter circuit design information 522 via a user interface 524 coupled to the design computer 514. The circuit design information 522 may include design information representing at least one physical property of a semiconductor device, such as the memory device 100 of FIG. 1, the memory device 200 of FIG. 2, the memory device 300 of FIG. 3, or any combination thereof. To illustrate, the circuit design property may include identification of particular circuits and relationships to other elements in a circuit design, positioning information, feature size information, interconnection information, or other information representing a physical property of a semiconductor device.

The design computer 514 may be configured to transform the design information, including the circuit design information 522, to comply with a file format. To illustrate, the file formation may include a database binary file format representing planar geometric shapes, text labels, and other information about a circuit layout in a hierarchical format, such as a Graphic Data System (GDSII) file format. The design computer 514 may be configured to generate a data file including the transformed design information, such as a GDSII file 527 that includes information describing the system 100 of FIG. 1, the memory device 100 of FIG. 1, the memory device 200 of FIG. 2, the memory device 300 of FIG. 3, or any combination thereof, in addition to other circuits or information. To illustrate, the data file may include information corresponding to a system-on-chip (SOC) that includes at least one of the memory device 100 of FIG. 1, the memory device 200 of FIG. 2, the memory device 300 of FIG. 3, and that also includes additional electronic circuits and components within the SOC.

The GDSII file 526 may be received at a fabrication process 528 to manufacture the memory device 100 of FIG. 1, the memory device 200 of FIG. 2, the memory device 300 of FIG. 3, or any combination thereof, according to transformed information in the GDSII file 526. For example, a device manufacture process may include providing the GDSII file 526 to a mask manufacturer 530 to create one or more masks, such as masks to be used for photolithography processing, illustrated as a representative mask 532. The mask 532 may be used during the fabrication process to generate one or more wafers 534, which may be tested and separated into dies, such as a representative die 536. The die 536 includes a circuit including the memory device 100 of FIG. 1, the memory device 200 of FIG. 2, the memory device 300 of FIG. 3, or any combination thereof.

The die 536 may be provided to a packaging process 538 where the die 536 is incorporated into a representative package 540. For example, the package 540 may include the single die 536 or multiple dies, such as a system-in-package (SiP) arrangement. The package 540 may be configured to conform to one or more standards or specifications, such as Joint Electron Device Engineering Council (JEDEC) standards.

Information regarding the package 540 may be distributed to various product designers, such as via a component library stored at a computer 546. The computer 546 may include a processor 548, such as one or more processing cores, coupled to a memory 510. A printed circuit board (PCB) tool may be stored as processor executable instructions at the memory 550 to process PCB design information 542 received from a user of the computer 546 via a user interface 544. The PCB design information 542 may include physical positioning information of a packaged semiconductor device on a circuit board, the packaged semiconductor device corresponding to the package 540 including the memory device 100 of FIG. 1, the memory device 200 of FIG. 2, the memory device 300 of FIG. 3, or any combination thereof.

The computer 546 may be configured to transform the PCB design information 542 to generate a data file, such as a GERBER file 552 with data that includes physical positioning information of a packaged semiconductor device on a circuit board, as well as layout of electrical connections such as traces and vias, where the packaged semiconductor device corresponds to the package 540 including the memory device 100 of FIG. 1, the memory device 200 of FIG. 2, the memory device 300 of FIG. 3, or any combination thereof. In other embodiments, the data file generated by the transformed PCB design information may have a format other than a GERBER format.

The GERBER file 552 may be received at a board assembly process 554 and used to create PCBs, such as a representative PCB 556, manufactured in accordance with the design information stored within the GERBER file 552. For example, the GERBER file 552 may be uploaded to one or more machines for performing various steps of a PCB production process. The PCB 556 may be populated with electronic components including the package 540 to form a represented printed circuit assembly (PCA) 558.

The PCA 558 may be received at a product manufacture process 560 and integrated into one or more electronic devices, such as a first representative electronic device 562 and a second representative electronic device 564. As an illustrative, non-limiting example, the first representative electronic device 562, the second representative electronic device 564, or both, may be selected from the group of a set top box, a music player, a video player, an entertainment unit, a navigation device, a communications device, a personal digital assistant (PDA), a fixed location data unit, and a computer. As another illustrative, non-limiting example, one or more of the electronic devices 562 and 564 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although one or more of FIGS. 1-3 may illustrate remote units according to the teachings of the disclosure, the disclosure is not limited to these exemplary illustrated units. Embodiments of the disclosure may be suitably employed in any device which includes active integrated circuitry including memory and on-chip circuitry for test and characterization.

Thus, the memory device 100 of FIG. 1, the memory device 200 of FIG. 2, the memory device 300 of FIG. 3, or any combination thereof, may be fabricated, processed, and incorporated into an electronic device, as described in the illustrative process 500. One or more aspects of the embodiments disclosed with respect to FIGS. 1-3 may be included at various processing stages, such as within the library file 512, the GDSII file 526, and the GERBER file 552, as well as stored at the memory 510 of the research computer 506, the memory 518 of the design computer 514, the memory 550 of the computer 546, the memory of one or more other computers or processors (not shown) used at the various stages, such as at the board assembly process 554, and also incorporated into one or more other physical embodiments such as the mask 532, the die 536, the package 540, the PCA 558, other products such as prototype circuits or devices (not shown), or any combination thereof. Although various representative stages of production from a physical device design to a final product are depicted, in other embodiments fewer stages may be used or additional stages may be included. Similarly, the process 500 may be performed by a single entity, or by one or more entities performing various stages of the process 500.

Figure 6:
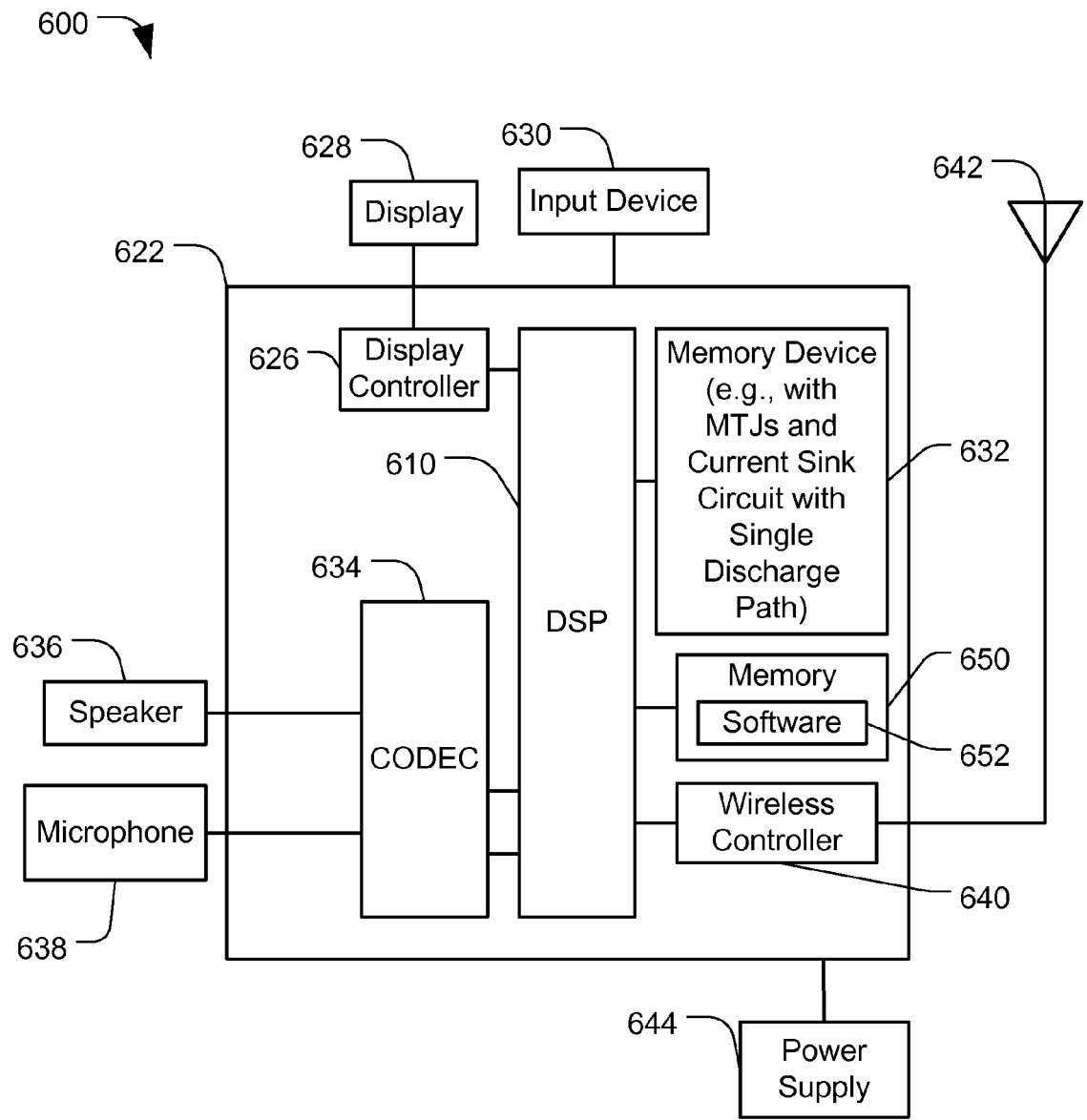
FIG. 6 is an illustrative embodiment of an electronic device that includes a local current sink.

Referring to FIG. 6, a block diagram of a particular illustrative embodiment of an electronic device including a memory device 632 with MTJs and a single transistor current sink circuit, is depicted and generally designated 600. The device 600 includes a processor, such as a digital signal processor (DSP) 610, coupled to the memory device 632. In an illustrative example, the memory device 632 includes the memory device 100 of FIG. 1, the memory device 200 of FIG. 2, and the memory device of FIG. 3, operates in accordance with the method of FIG. 4, or any combination thereof. A memory 650 includes software 652 that is accessible to the Digital Signal Processor (DSP) 610. In a particular embodiment, the memory 650 is a computer readable tangible medium storing computer executable instructions (e.g., the software 652) that are executable by the DSP 610. The software 652 may be executable by the DSP 610 to initiate a first write operation at a Magnetic Tunnel Junction (MTJ) coupled to a bit line and to a source line at the memory device 632. The first write operation applies a first voltage to the bit line to store a first data value at the MTJ and has a first discharge path to ground via a write driver. The software 652 may be executable by the DSP 610 to initiate a second write operation at the MTJ. The second write operation applies a second voltage to the source line to store a second data value at the MTJ and has a second discharge path to ground via a current sink circuit. The first discharge path is shorter than the second discharge path.

FIG. 6 also shows a display controller 626 that is coupled to the digital signal processor 610 and to a display 628. A coder/decoder (CODEC) 634 can also be coupled to the digital signal processor 610. A speaker 636 and a microphone 638 can be coupled to the CODEC 634.

FIG. 6 also indicates that a wireless controller 640 can be coupled to the digital signal processor 610 and to a wireless antenna 642. In a particular embodiment, the DSP 610, the display controller 626, the memory 632, the CODEC 634, and the wireless controller 640, are included in a system-in-package or system-on-chip device 622. In a particular embodiment, an input device 630 and a power supply 644 are coupled to the system-on-chip device 622. Moreover, in a particular embodiment, as illustrated in FIG. 6, the display 628, the input device 630, the speaker 636, the microphone 638, the wireless antenna 642, and the power supply 644 are external to the system-on-chip device 622. However, each of the display 628, the input device 630, the speaker 636, the microphone 638, the wireless antenna 642, and the power supply 644 can be coupled to a component of the system-on-chip device 622, such as an interface or a controller.

Those of skill would further appreciate that the various illustrative logical blocks, configurations, modules, circuits, and algorithm steps described in connection with the embodiments disclosed herein may be implemented as electronic hardware, computer software instructions executable by a processing device, or combinations of both. Various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An electronic device comprising:
   a first write driver;
   a second write driver;
   at least one magnetic tunnel junction (MTJ) coupled to a bit line and coupled to a source line;
   a current sink circuit comprising transistors serially coupled together and coupled to the bit line and to the source line;
   a first path from the first write driver to the second write driver via the MTJ, wherein the first path has a first length; and
   a second path from the first write driver to the current sink circuit via the MTJ, wherein the second path has a second length, and wherein:
   when a first write operation is performed and the first length is shorter than the second length, a write current flows from the first write driver to the MTJ and to the second write driver,
   when the first write operation is performed and the second length is shorter than the first length, the write current flows from the first write driver to the MTJ and to the current sink circuit, and
   when a second write operation is performed, the write current flows from the second write driver to the MTJ and to the first write driver.

2. The electronic device of claim 1, wherein the transistors comprise a first transistor configured to provide a single discharge path from the bit line to a local ground and a second transistor responsive to a signal to selectively block a discharge of the bit line through the single discharge path.

3. The electronic device of claim 2, wherein the MTJ comprises a free layer, a tunnel barrier layer, and a pinned layer, and wherein the MTJ is coupled to the source line via an access transistor.

4. The electronic device of claim 1, wherein the MTJ is coupled to the bit line between the current sink circuit and the first write driver or the second write driver.

5. The electronic device of claim 1, wherein the transistors comprise a first transistor having a gate coupled to the source line and a source terminal coupled to the bit line.

6. The electronic device of claim 1, further comprising a multiplexer coupling the bit line and the source line to the first write driver and the second write driver.

7. The electronic device of claim 1, further comprising at least one additional MTJ coupled to the bit line.

8. The electronic device of claim 1, wherein the MTJ is incorporated into a spin torque transfer magnetoresistive random access memory (STT-MRAM) device.

9. The electronic device of claim 1, wherein the first write driver, the second write driver, the MTJ, and the current sink circuit are integrated in at least one semiconductor die.

10. The electronic device of claim 1, further comprising a device selected from a set top box, a music player, a video player, an entertainment unit, a navigation device, a communications device, a personal digital assistant (PDA), a fixed location data unit, and a computer, into which the first write driver, the second write driver, the MTJ, and the current sink circuit are integrated.

11. An electronic device, comprising:
   at least one resistive memory coupled to a bit line and to a source line;
   a current sink circuit that comprises serially coupled transistors corresponding to a single discharge path, wherein the single discharge path is configured to couple the bit line to a local ground;
   a first path from a first write driver to a second write driver via the at least one resistive memory, wherein the first path has a first length; and
   a second path from the first write driver to the current sink circuit via the at least one resistive memory, wherein the second path has a second length, and wherein:
   when a first write operation is performed and the first length is shorter than the second length, a write current flows from the first write driver to the at least one resistive memory and to the second write driver,
   when the first write operation is performed and the second length is shorter than the first length, the write current flows from the first write driver to the at least one resistive memory and to the current sink circuit, and when a second write operation is performed, the write current flows from the second write driver to the at least one resistive memory and to the first write driver.

12. The electronic device of claim 11, wherein the serially coupled transistors comprise a first transistor configured to selectively couple the bit line to the local ground in response to a voltage at the source line.

13. The electronic device of claim 12, wherein the serially coupled transistors further comprise a second transistor that is responsive to a signal to selectively block a discharge of the bit line through the single discharge path.

14. The electronic device of claim 11, wherein the at least one resistive memory and the current sink circuit are incorporated into a resistive random access memory (R-RAM) device.

15. The electronic device of claim 11, wherein a first parasitic resistance at the bit line during the first write operation that includes the current sink circuit being activated is less than a second parasitic resistance at the bit line occurring during the second write operation that includes the current sink circuit being deactivated.

16. The electronic device of claim 15, wherein the first parasitic resistance contributes to a first source loading effect and wherein the second parasitic resistance contributes to a second source loading effect that is greater than the first source loading effect.

17. The electronic device of claim 11, wherein the current sink circuit has a capacitance of less than or equal to one nanofarad.

18. The electronic device of claim 11, further comprising a test mode signal line coupled to the current sink circuit.

19. The electronic device of claim 18, wherein a test mode signal sent via the test mode signal line selectively blocks a discharge operation via the single discharge path.

20. The electronic device of claim 11, wherein a particular transistor of the serially coupled transistors has a width less than or equal to two micrometers.

21. The electronic device of claim 11, wherein the at least one resistive memory and the current sink circuit are integrated in at least one semiconductor die.

22. The electronic device of claim 11, further comprising a device selected from a set top box, a music player, a video player, an entertainment unit, a navigation device, a communications device, a personal digital assistant (PDA), a fixed location data unit, and a computer, into which the at least one resistive memory and the current sink circuit are integrated.

23. An apparatus comprising:
  means for applying a first write voltage to a source line or a bit line;
  means for applying a second write voltage to the source line or the bit line;
  means for storing a data value, wherein the means for storing the data value is coupled to the source line and to the bit line;
  means for providing a discharge path to the bit line during a first write operation, wherein the means for providing the discharge path is coupled to the source line and to the bit line and comprises first means for selecting that is serially coupled to second means for selecting;
  a first path from the means for applying the first write voltage to the means for applying the second write voltage via the means for storing the data value, wherein the first path has a first length; and
  a second path from the means for applying the first write voltage to the means for providing the discharge path via the means for storing the data value, wherein the second path has a second length, and wherein:
    when a first write operation is performed and the first length is shorter than the second length, a write current flows from the means for applying the first write voltage to the means for storing the data value and to the means for applying the second write voltage,
    when the first write operation is performed and the second length is shorter than the first length, the write current flows from the means for applying the first write voltage to the means for storing the data value and to the means for providing the discharge path, and
    when a second write operation is performed, the write current flows from the means for applying the second write voltage to the means for storing the data value and to the means for applying the first write voltage.

24. The apparatus of claim 23, wherein the means for storing the data value comprises at least one magnetic tunnel junction (MTJ).

25. The apparatus of claim 23, wherein the means for applying the first write voltage, the means for applying the second write voltage, the means for storing the data value, and the means for providing the discharge path are integrated in at least one semiconductor die.

26. The apparatus of claim 23, further comprising a device selected from a set top box, a music player, a video player, an entertainment unit, a navigation device, a communications device, a personal digital assistant (PDA), a fixed location data unit, and a computer, into which the means for applying the first write voltage, the means for applying the second write voltage, the means for storing the data value, and the means for providing the discharge path are integrated.

* * * * *